United States Patent
Kashihara et al.

(10) Patent No.: US 6,711,070 B2
(45) Date of Patent: Mar. 23, 2004

(54) SEMICONDUCTOR MEMORY DEVICE OPERATING IN SYNCHRONIZATION WITH CLOCK SIGNAL

(75) Inventors: Yoji Kashihara, Hyogo (JP); Shigeki Ohbayashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/222,863

(22) Filed: Aug. 19, 2002

(65) Prior Publication Data

US 2003/0156464 A1 Aug. 21, 2003

(30) Foreign Application Priority Data

Feb. 20, 2002 (JP) ........................................ 2002-043557

(51) Int. Cl.[7] .............................................. G11C 8/00
(52) U.S. Cl. ................... 365/189.07; 365/154
(58) Field of Search ...................... 365/189.07, 189.08, 365/154, 203

(56) References Cited

U.S. PATENT DOCUMENTS

5,473,561 A * 12/1995 Jones et al. ............ 365/189.07
5,515,325 A    5/1996 Wada ..................... 365/189.01

FOREIGN PATENT DOCUMENTS

JP            2-113492           4/1990

* cited by examiner

*Primary Examiner*—Tan T. Nguyen
(74) *Attorney, Agent, or Firm*—McDermott, Will & Emery

(57) ABSTRACT

A comparator of a synchronous SRAM includes: n+1 EX-OR gates for detecting whether or not n+1 signals included in an address signal inputted in a cycle and n+1 signals included in an address signal inputted in the next cycle coincide with each other; and wired OR gates receiving output signals of the n+1 EX-OR gates. Accordingly, a detecting speed is faster than in a prior art practice where an OR gate is constituted of NOR gates and NAND gates at multiple stages.

11 Claims, 14 Drawing Sheets

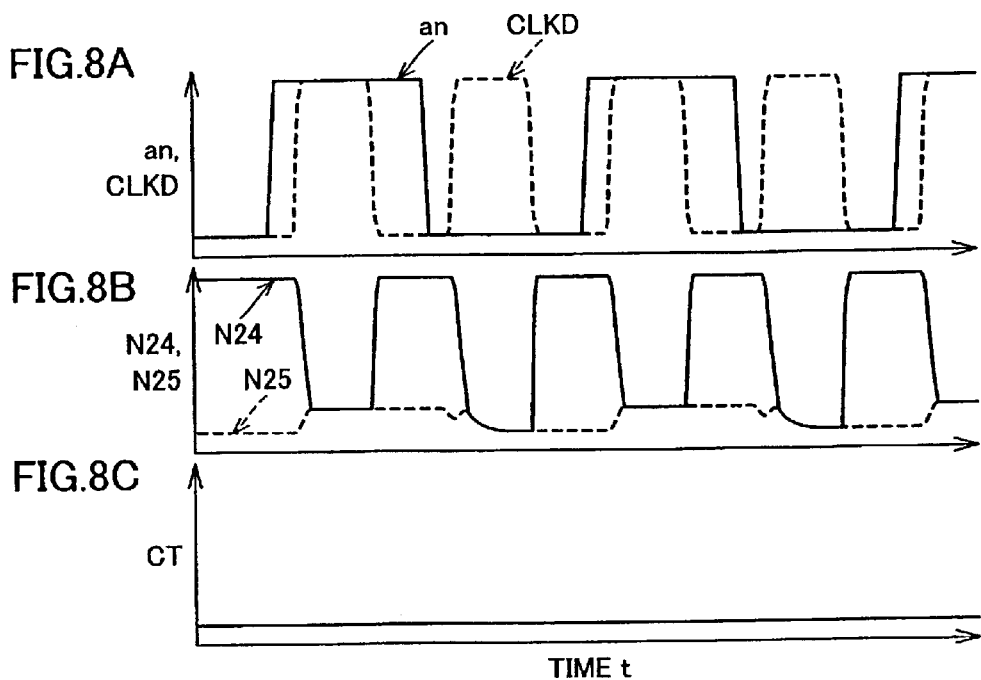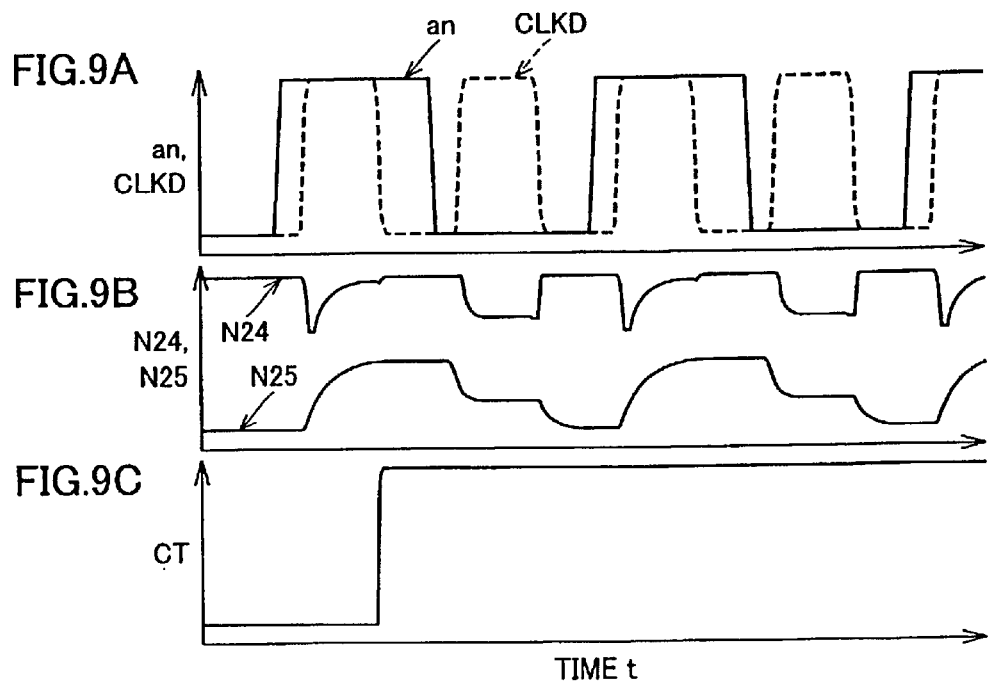

TIME t

SEMICONDUCTOR MEMORY DEVICE OPERATING IN SYNCHRONIZATION WITH CLOCK SIGNAL

BACKGROUND OF THE INVENTION

1. Field of the Invention

The present invention relates to a semiconductor memory device, and more particularly to a semiconductor memory device capturing an address signal in response to a leading edge of a clock signal.

2. Description of the Background Art

In recent years, kinds of synchronous static random access memories (hereinafter referred to as synchronous SRAM) have increased in order to improve an operating frequency and a utilization efficiency of a bus. Synchronous SRAM is SRAM operating in synchronization with a clock signal. Synchronous SRAM is classified into a flow-through type and a pipe-line type according to a difference in read latency and again classified into an early-write type, a late-write type and a double-late-write type according to a difference in write latency.

FIG. 15 is a time chart showing read operations in flow-through type synchronous SRAM and pipe-line type synchronous SRAM. In FIG. 15, not only is an address signal ADD inputted in synchronization with a rising edge of clock signal CLK, but a read command is also inputted by a control signal WE. Q(T) indicates a read data signal of the flow-through type and Q(PL) indicates a read data signal of the pipe-line type.

A difference in read latency is a difference in the number of cycles between when address signal ADD and a read command are inputted and when a data signal Q corresponding to address signal ADD is outputted. That is, in a case of the flow-through type, a corresponding data signal Q(A0) is outputted in a cycle 0 in which an address signal (for example, A0) is inputted, whereas in a case of the pipe-line type, corresponding data signal Q(A0) is outputted in a cycle 1 subsequent to cycle 0 in which address signal A0 is inputted.

FIG. 16 is a time chart showing write operations in early-write type synchronous SRAM, late-write type synchronous SRAM and double-late-write type synchronous SRAM. In FIG. 16, not only is address signal ADD is inputted in synchronization with a rising edge of clock signal CLK, but a write command is inputted by control signal WE. D(EW), D(LW) and D(DLW) indicate write data signals of the early-write type, the late-write type and the double-late write type, respectively.

A difference in write latency is a difference in the number of cycles between when address signal ADD and a write command are inputted and when a data signal D corresponding to address signal ADD is inputted. That is, in a case of the early-rate type, a corresponding data signal D(A0) is inputted in the same cycle 0 as input cycle 0 in which an address signal (for example, A0) is inputted, whereas in a case of the late-write type, a corresponding data signal D(A0) is inputted in a cycle 1 subsequent to input cycle 0 in which address signal A0 is inputted. In a case of the double-late-write, a corresponding data signal D(A0) is inputted in a cycle subsequent to a cycle 2 again subsequent to input cycle 0 in which address signal A0 is inputted.

In a case where the late-write scheme or the double-late-write scheme is adopted, if a write operation and a read operation are alternately performed, two address signals A0 and A1 consecutively inputted, when being different from each other, cause no problem, whereas two address signals A0 and A1, when being the same as each other, cause an inconvenience that a data signal is read from a memory cell to which no data signal D has not yet been written. Therefore, in order to eliminate such an inconvenience, there is provided a comparator for detecting whether or not two consecutively inputted address signals A0 and A1 coincide with each other in late-write or double-late write synchronous SRAM.

FIG. 17 is a circuit diagram showing a configuration of such a comparator 70. It is set that one address signal of two address signals ADD inputted consecutively includes data signals a0 to an (where n is an integer of 0 or more), while the other address signal ADD includes data signals b0 to bn. In FIG. 17, comparator 70 includes: an EX-OR gates 71.0 to 71.n; an OR gate 72; inverters 76 and 77; and a latch circuit 78.

Data signals a0 to an are inputted to respective EX-OR gates 71.0 to 71.n at one input nodes thereof. DATA signals b0 to bn are inputted to respective EX-OR gates 71.0 to 71.n at the other input nodes thereof. OR gate 72 is constructed of plural 2-input NOR gates 73, 74, . . . , 3-input NAND gate 75 and others. The reason why many of 2-input NOR gates and a 3-input NAND gates are used is that it is unrealistic in terms of efficiency to use 4-input or more NOR gates and NAND gates. OR gate 72 receives output signals of EX-OR gates 71.0 to 71.n and an output signal thereof is inverted by inverter 76 and the inverted signal is inputted to latch circuit 78 at the data input terminal D. Latch circuit 78 is in a through state during a period when the inverted signal /CLK of clock signal CLK is at H level to output the inverted signal of an input signal, and holds and outputs a signal at a level of a signal inputted directly prior to transition of clock signal /CLK to L level in response to the transition. An output signal of latch circuit 78 is inverted by inverter 77 to become an output signal CT of comparator 74.

In a case where data signals a0 to an and data signals b0 to bn coincide with each other, output signals of EX-OR gates 71.0 to 71.n all assume L level and an output signal of OR gate 72 assumes L level to cause signal CT to be at H level. In a case where data signals a0 to an and data signals b0 to bn do not coincide with each other, an output signal of at least one EX-OR gate of EX-OR gates 71.0 to 71.n assumes H level and an output signal of OR gate 72 assumes H level to cause signal CT to be at L level. In synchronous SRAM, a read operation is switched in response to signal CT.

In prior art comparator 70, however, since OR gate 72 is constructed of NOR gates and NAND gates at multiple stages, a time is longer between when data signals a0 to an and data signals b0 to bn are made firm and when a result of comparison is outputted, having resulted in a problem of a slower operating speed in SRAM.

SUMMARY OF THE INVENTION

Accordingly, a main object of the present invention is to provide a semiconductor memory device with a high operating speed.

A semiconductor memory device according to the present invention includes: plural memory cells; a select circuit selecting a memory cell of the plural memory cells according to an address signal captured in response to an leading edge of a clock signal; a write/read circuit performing writing/reading of a data signal to/from a memory cell selected by the select circuit; and a coincidence/non-coincidence detecting circuit detecting whether or not inputted two address signals coincide with each other to output a control signal controlling the write/read circuit on the basis of a result of the detection. The coincidence/non-coincidence detecting circuit includes: a charge circuit for charging a prescribed node to a first potential; plural discharge circuits provided correspondingly to respective plural signals included in an address signal, and each receiving respective corresponding two signals included in inputted two address signals to discharge the prescribed node to a second potential in response to a situation where two signals that each discharge circuit has received are different from each other in logical level; and a signal generating circuit generating the control signal on the basis of a potential of the prescribed node. Therefore, since no necessity arises for use of NOR gates and NAND gates at multiple stages adopted in a prior art practice, a result of the detection of whether or not two address signals coincide with each other can be quickly obtained, thereby enabling a high operation speed in a semiconductor memory device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A to 8C are time charts for describing a problematic point of the first and second embodiments;

FIGS. 9A to 9C are other time charts for describing a problematic point of the first and second embodiments;

DESCRIPTION OF THE PREFERRED EMBODIMENTS (First Embodiment)

Figure 1:
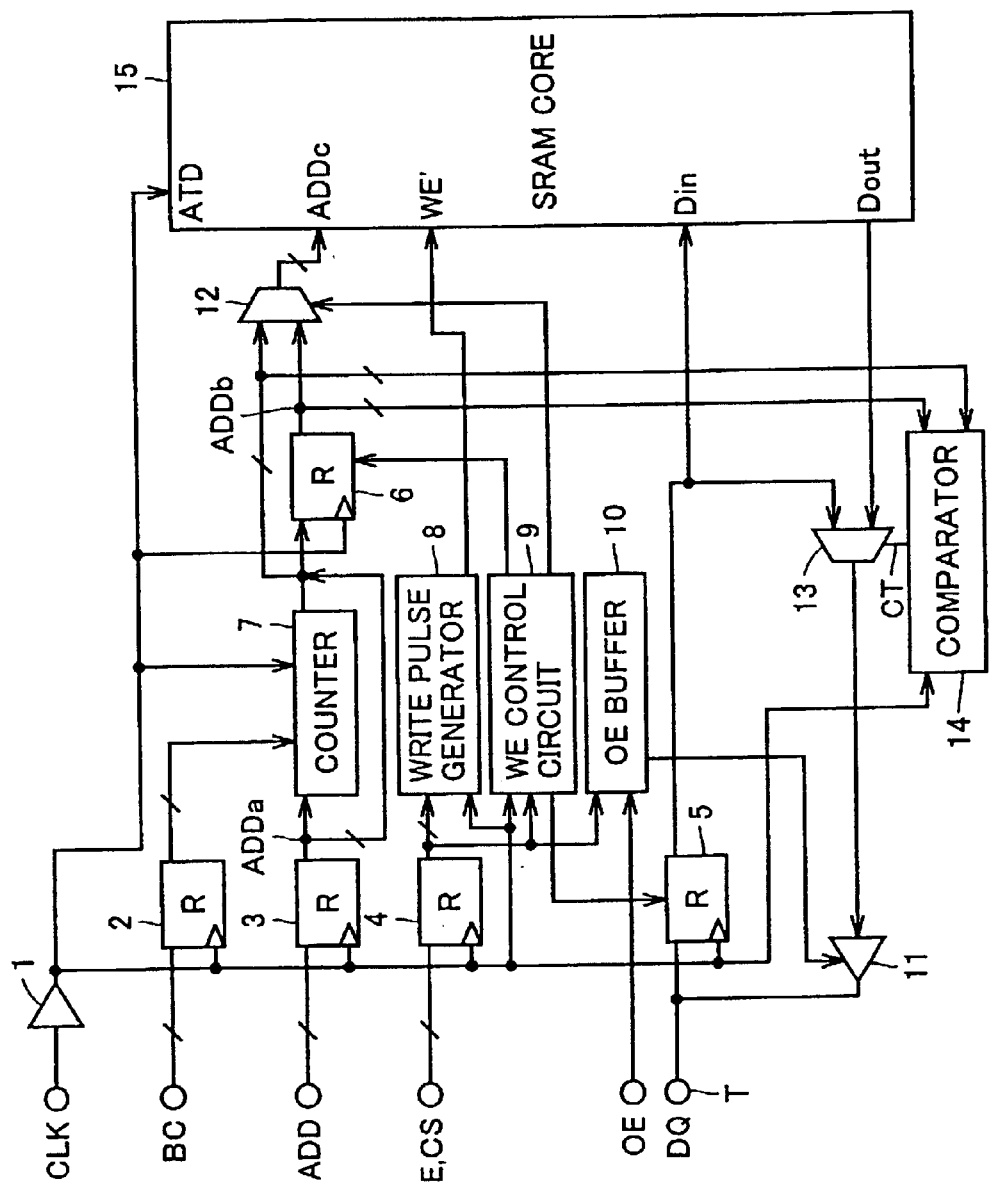
FIG. 1 is a circuit block diagram showing an overall configuration of a synchronous SRAM according to a first embodiment of the present invention.

FIG. 1 is a block diagram showing an overall configuration of a late-write or flow-through synchronous SRAM according to a first embodiment of the present invention.

In FIG. 1, SRAM includes: a clock buffer 1; registers 2 to 6; a counter 7, a write pulse generator 8; a WE control circuit 9; an OE buffer 10; an output buffer 11; selectors 12 and 13; a comparator 14; and a SRAM core 15.

Figure 2:
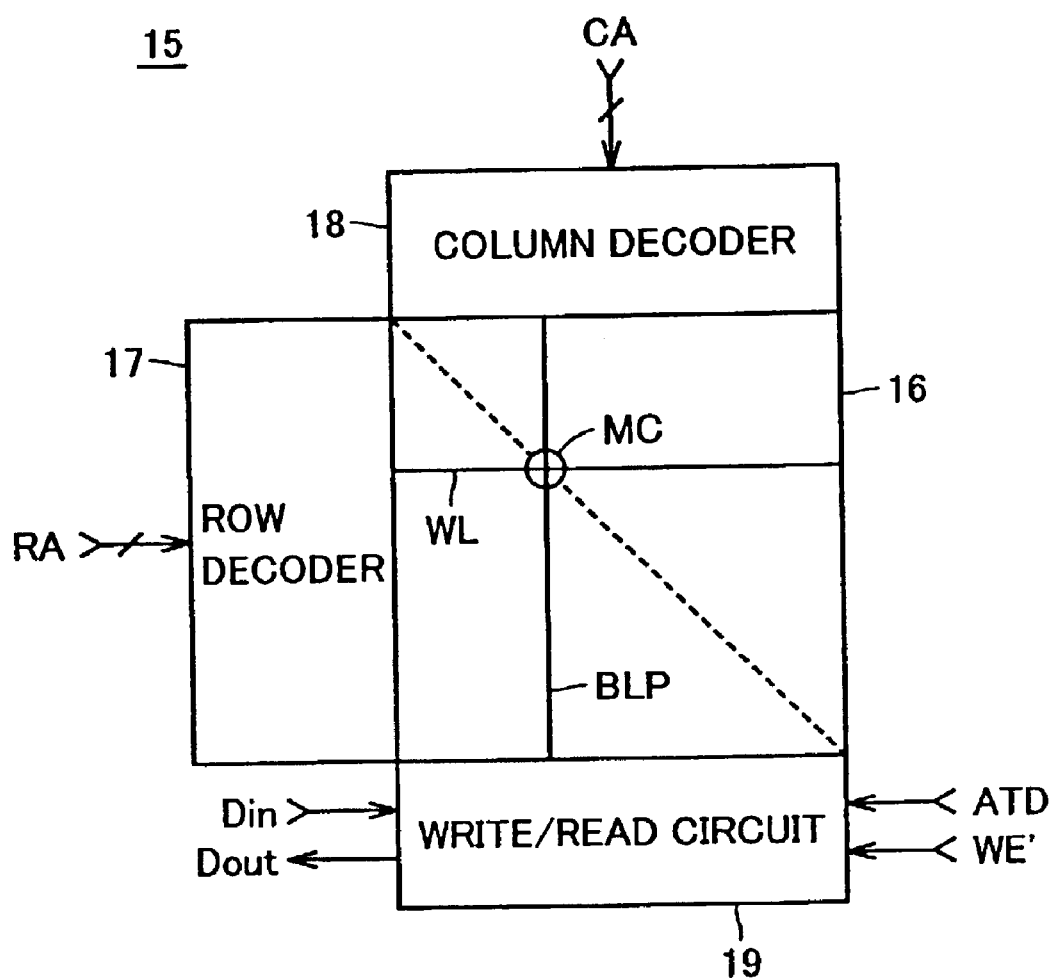
FIG. 2 is a block diagram showing a configuration of SRAM core shown in FIG. 1.

SRAM core 15, as shown in FIG. 2, includes: a memory array 16; a row decoder 17; a column decoder 18; and a write/read circuit 19. Memory array 16 includes: plural memory cells MC arranged in a matrix of plural rows and plural columns; plural word lines WL provided correspondingly to respective plural rows; and a plural bit line pairs BLP provided correspondingly to respective plural columns. To each memory cell MC, a peculiar row address and column address are assigned in advance. Each memory cell MC stores one bit data thereon.

Row decoder 17, according to a row address signal RE, selects one word line WL of plural word lines WL to drive selected word line WL to a select level and to activate plural memory cells MC corresponding to selected word line WL. Column decoder 18, according to a column address CA, selects one bit line pair BLP of plural bit line pairs BLP.

Write/read circuit 19 is controlled by signals ATD and WE' to perform writing/reading of a data signal to/from memory cell MC selected by decoders 17 and 18. That is, write/read circuit 19, in a write operation, writes data signal Din to memory cell MC activated by row decoder 17 through bit line pair BLP selected by column decoder 8. Moreover, write/read circuit 19, in a read operation, reads data signal Dout of memory cell MC activated by row decoder 17 through bit line pair BLP selected by column decoder 18.

Returning to FIG. 1, not only does clock buffer 1 transmit clock signal to SRAM in the entirety, but also generates control signal ATD in synchronization with clock signal CLK to give the signal to SRAM core 15. Each of registers 2 to 6 captures a level of an input signal during a period when clock CLK is at L level to hold and output the level of the input signal that each has captured, in response to an rising edge of clock signal CLK.

That is, register 2, in synchronization with clock signal CLK, transmits a burst control signal BC to counter 7. Register 3, in synchronization with clock CLK, gives address signal ADD to counter 7, register 6 and selector 12. Register 4, in synchronization with clock signal CLK, transmits control signals WE and CS to write pulse generator 8, WE control circuit 9 and OE buffer 10. Register 5 is activated/deactivated by WE control circuit 9 to, in synchronization with clock signal CLK, give write data signal D to SRAM core 15 and selector 13. To be concrete, register 5 holds and outputs data signal D in a cycle subsequent to a cycle in which a write command was inputted.

Counter 7 is reset when a burst start is instructed by a burst control signal BC to hold and output address signal ADDa given from resistor 3. Moreover, counter 7, when a burst start is instructed by burst control signal BC, outputs address signal ADDa' more advanced than a previous cycle.

Register 6 is activated/deactivated by WE control circuit 9 to, in synchronization with clock signal CLK, gives an output signal of register 3 or counter 7 to selector 12. To be concrete, register 6 holds and outputs address signal ADD in a cycle in which a write command was inputted, in a cycle subsequent to the cycle in which the write command was inputted.

Selector 12 is controlled by WE control circuit 9 to give address signal ADDb from register 6 to SRAM core 15 in a cycle in which a write command is inputted, while giving address signal ADDa from register 3 or counter 7 to SRAM core 15 in a cycle in which a read command is inputted. An output address signal ADDc of selector 12 includes row address signal RA and column address signal CA.

Write pulse generator 8 generates write pulse signal WE' according to control signals WE and SC from register 4 to give write pulse signal WE' that the generator 8 has generated to SRAM score 15. WE control circuit 9 controls register 6 and selector 12 according to clock signal CLK and control signals WE and CS from register 4. OE buffer 10 controls output buffer 11 according to control signal OE and control signals WE and CS from register 4.

Comparator 14 compares address signal ADD from register 3 or counter 7 and address signal ADD from register 6 with each other and if two address signal ADD coincide with each other, causes signal CT to be at H level while if not, causes signal CT to be at L level.

Selector 13 receives data signal D from register 5 and data signal Dout from SRAM core 15 to, if signal CT is at H level, give data signal D from register 5 to output buffer 11 while if signal CT is at L level, giving data signal Dout from SRAM core 15 to output buffer 11. Output buffer 11, in response to an output signal of OE buffer 10, outputs data signal D or Dout from selector 13 to a data Input/output terminal T.

Figure 3:
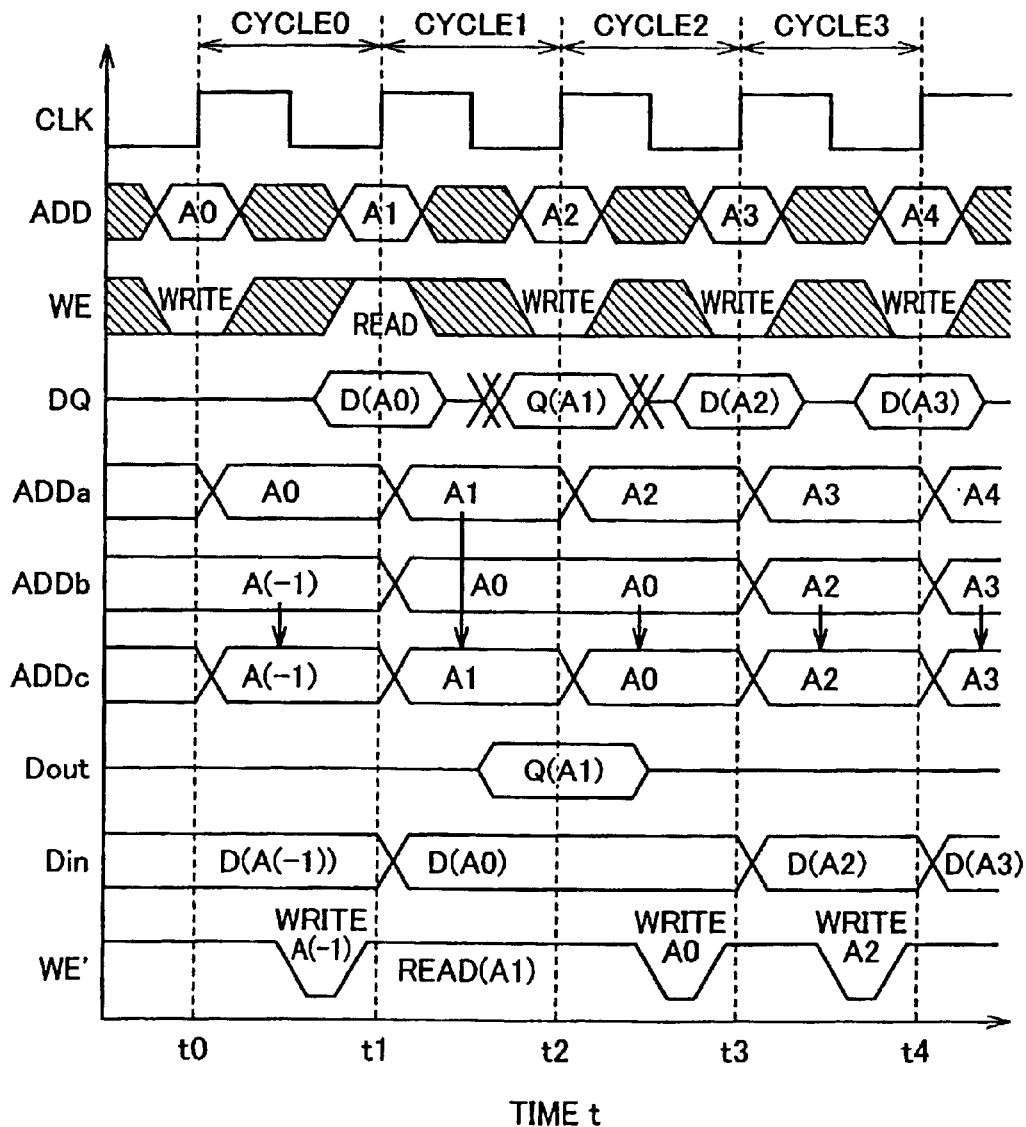
FIG. 3 is a time chart showing a write/read operation in synchronous SRAM shown in FIG. 1.

Next, description will be given of a read/write operation in SRAM. In FIG. 3, not only is address signal A0 inputted in synchronization with a rising edge (time point t0) of clock signal CLK, but a write command is also inputted by control signal WE. Furthermore, not only is address signal A1 inputted in synchronization with the next rising edge (time point t1) of clock signal CLK, but a read command is also inputted by control signal WE. It is assumed that a read command was inputted at the rising edge prior to time point t0.

Register 3 holds and outputs address signal A0 in cycle 0 in which address A0 is inputted (ADDa=A0). Register 6 holds and outputs address signal A0 in a cycle 1 subsequent to cycle 0 in which a write command is inputted, that is cycle 1 in which address signal 1 is inputted (ADDb=A0). Since cycle (−1) preceding a cycle in which address signal A0 is inputted is a read cycle, output address signal ADDb of register 6 does not change in cycle 0 in which address signal A0 is inputted.

Since selector 12 selects output address signal ADDb of register 6 in a cycle in which a write command is inputted, address signal A(−1) inputted in a preceding write cycle is output address signal ADDc of selector 12, in write cycle 0 in which address A0 is inputted (ADDc=A(−1)).

Since at this time, register 5 holds and outputs data D in a cycle subsequent to a cycle in which a write command is inputted, register 5 holds and outputs previous write data signal D(A(−1)) in a cycle 0 in which address A0 is inputted. Therefore, previous write address signal A(−1) is given to SRAM core 15 in cycle 0 in which address A0 is inputted and data signal D(A(−1)) is written to memory cell MC corresponding to write address signal A(−1).

Next, in read cycle 1 in which address signal A1 is inputted, register 3 latches address signal A1 (ADDa=A1).

Register 6 latches write address signal A0 in the previous cycle 0, since cycle 1 in which address signal A1 is inputted is a cycle 1 subsequent to cycle 0 in which a write command was inputted (ADDb=A0).

Since cycle 1 in which address signal A1 is inputted is a read cycle, selector 12 selects output signal A1 of register 3 to give the signal to selected SRAM core 15 (ADDc=A1). SRAM core 15 delays a read data signal Q(A1) by a prescribed delay time to output the signal (Dout=Q(A1)).

Here, in a case where output address signals A0 and A1 of registers 3 and 6 are different from each other, no specific problem arises and output data Q(A1) of SRAM core 15 is outputted to data input/out put terminal T through selector 13 and output buffer 11. In a case where output signals A0 and A1 of registers 3 and 6 coincide with each other, however, write data signal D(A0) corresponding to address signal A0 is in a state of being still held in register 5 and has not been written to SRAM core 15. Accordingly, in this case, output data signal A0 of register 5 is necessary to be selected by selector 13.

Data signal D(A0) having not yet written to SRAM core 15 in cycle 1 in which address signal A1 is inputted is certainly written to SRAM core 15 in the next write cycle 2 independently of a comparison result in comparator 14 in read cycle 1.

Figure 4:
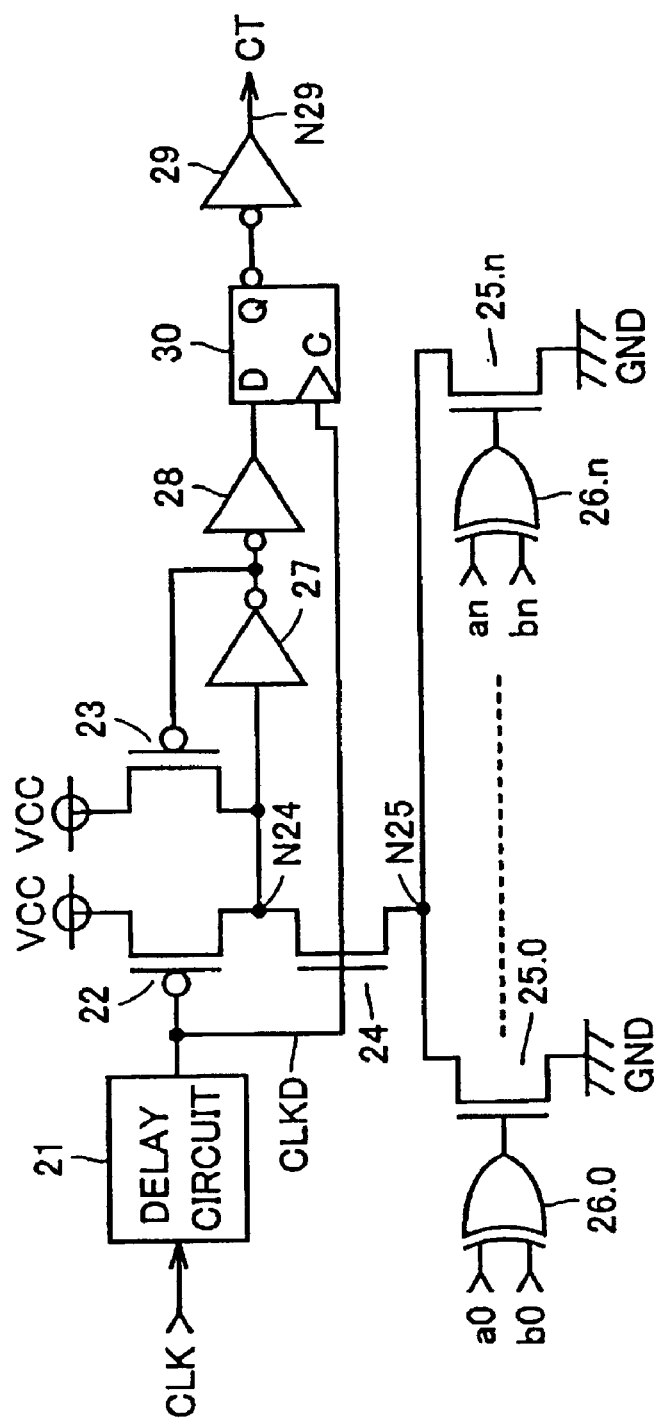
FIG. 4 is a circuit block diagram showing a configuration of a comparator shown in FIG. 1.
Figure 14:
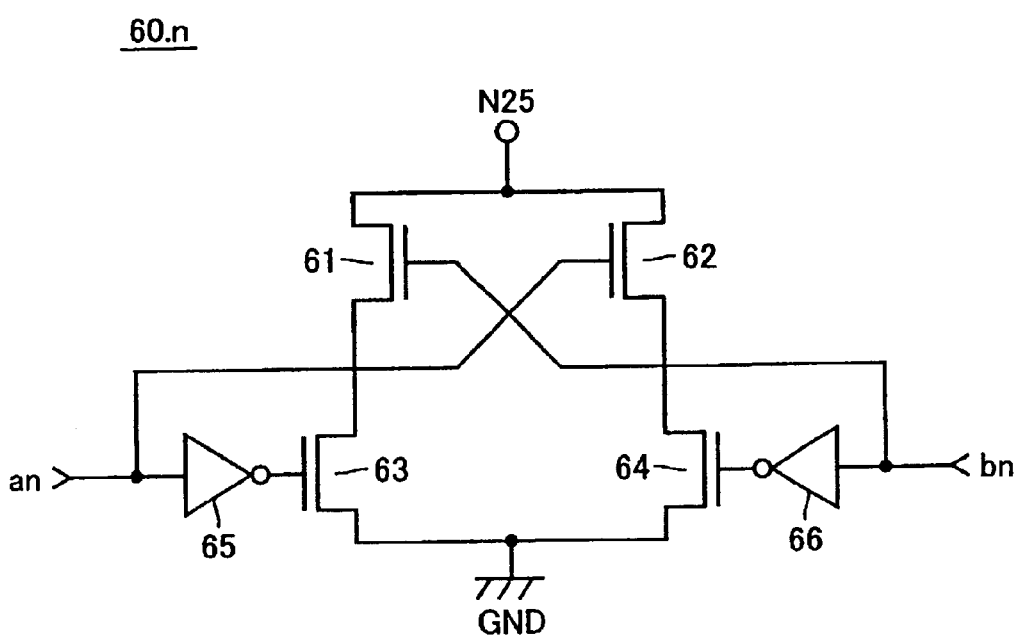
FIG. 14 is a circuit diagram showing a configuration of a comparison unit circuit included in a comparator of synchronous SRAM according to a fourth embodiment of the present invention.

FIG. 4 is a circuit diagram showing a configuration of comparator 14 as a feature of SRAM. In FIG. 14, comparator 14 includes: a delay circuit 12; P-channel MOS transistors 22 and 23; N-channel MOS transistors 24 and 25, and 25.0 to 25.n; EX-OR gates 26.0 to 26.n; inverters 27 to 29; and a latch circuit 30. Output address signal ADDa of register 3 includes: data signals a0 to an and output address signal ADDb includes: data signals b0 to bn.

Delay circuit 21 delays clock signal CLK by a prescribed time to generate a clock signal CLKD. P-channel MOS transistor 22 is connected between a line of power supply potential VCC and a node N24, N-channel MOS transistor 24 is connected between node N24 and a node N25 and the gates thereof both receive output clock signal CLKD of delay circuit 21.

In a case where clock signal CLKD is at L level, not only does P-channel MOS transistor 22 become conductive, but N-channel MOS transistor 24 also becomes non-conductive, thereby charging node N24 to H level (power supply potential VCC). In a case where clock signal CLKD is at H level, not only P does channel MOS transistor 22 become non-conductive to cease charging of node N24, but N-channel MOS transistor 24 also becomes conductive.

N-channel MOS transistor 25.0 to 25.n are connected in parallel between node N25 and a line of ground potential GND. Output address signals a0 to an of register 3 are inputted to respective one input nodes of EX-OR gates 26.0 to 26.n, while output address signals b0 to bn of register 6 are inputted to respective the other input nodes of EX-OR gates 26.0 to 26.n. Output signals of EX-OR gates 26.0 to 26.n are inputted to the gates of respective N-channel MOS transistors 25.0 to 25.n.

In a case where address signal a0 to an and address signal b0 to bn coincide with each other perfectly, output signals of EX-OR gates 26.0 to 26.n all assume L level to causes N-channel MOS transistors 25.0 to 25.n to be non-conductive, and levels of nodes N24 and N25 having been pre-charged to H level do not change.

In a case where address signals a0 to an and address signals b0 to bn are different from each other, an output signal of at least one EX-OR gate of EX-OR gates 26.0 to 26.n assumes H level to causes at least one N-channel MOS transistor of N-channel MOS transistors 25.0 to 25.n to be nonconductive, and levels of nodes N24 and N25 having been pre-charged to H level are lowered to L level.

Inverters 27 and 28, latch circuit 30 and inverter 29 are connected in series between node 24 and an output node 29. P-channel MOS transistor 23 has a prescribed current drive ability, is connected between a line of power supply potential VCC and node N24, and receives an output of an inverter 27 at the gate thereof. Inverter 27 has a prescribed threshold potential VT and, if a potential of node N24 is higher than prescribed threshold potential VT, outputs a signal at L level, while if a potential of node N24 is lower than prescribed threshold potential VT, outputting a signal at H level. Inverter 27 and P-channel MOS transistor 23 constitute a half latch circuit. When node N24 is at H level, an output signal of inverter 27 assumes L level to cause P-channel MOS transistor 23 to be conductive, thereby holding node N24 at H level.

Figure 5:
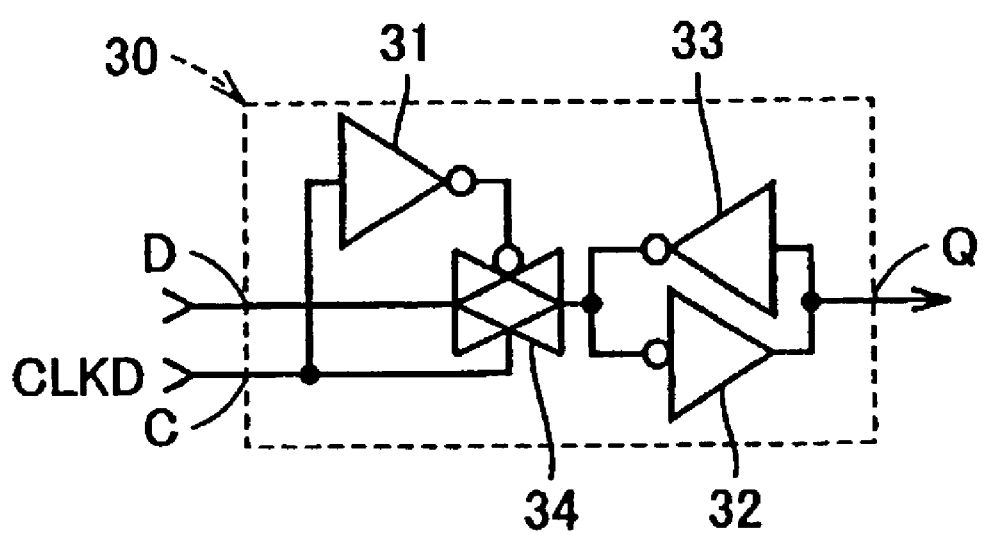
FIG. 5 is a circuit diagram showing a configuration of a latch circuit shown in FIG. 4.

Latch circuit 30, as shown in FIG. 5, includes: inverters 31 to 33; and a transfer gate 34. Transfer gate 34 and inverter 32 are connected in series between data input terminal D and data output terminal Q. Output clock signal CLKD of delay circuit 21 is inputted not only to the N-channel MOS transistor side gate of transfer gate 34 through clock terminal C, but also to the P-channel MOS TRNSISTOR side gate of transfer gate 34 through clock terminal C and inverter 31. Inverter 33 is connected in antiparallel to inverter 32.

When clock signal CLKD is at H level, transfer gate 34 becomes conductive to output the inverted signal of an input signal to output terminal Q. When clock signal CLKD is pulled down from H level to L level, transfer gate becomes non-conductive and a signal having been outputted directly prior to transition to the non-conduction is held and outputted by inverters 32 and 33. That is, when clock signal CLKD is at H level, latch circuit 30 enters a through state, while when clock signal CLKD is at L level, latch circuit 30 enters a hold state. An output signal of latch circuit 30 is inverted by inverter 29 into signal CT.

Next, description will be given of an operation in comparator 14. A delay time of delay circuit 21 is set to, for example, ¼ a cycle of a cycle clock signal CLK. During a period when clock signal CLKD is at L level, not only does P-channel MOS transistor 22 become conductive, but also N-channel MOS transistor 24 becomes non-conductive and node N24 is charged to H level. Furthermore, during the period, latch circuit 30 enters a hold state and a level of signal CT shows a comparative result in the previous cycle.

At time point t1 of FIG. 3, when clock signal CLK is raised from L level to H level, determined are output address signal ADDa=a0 to an of register 3 and output address signal ADDb=b0 to bn of register 6. Next, when clock signal CLKD is raised from L level to H level after a delay time of delay circuit 21 elapses, P-channel MOS transistor 22 becomes nonconductive while N-channel MOS transistor 24 becomes conductive to cause latch circuit 30 to be in a through state.

When address signal a0 to an and address signal b0 to bn are different from each other, nodes N24 and N25 assume L level, signal CT assumes L level and output data signal Dout of SRAM core 15 is outputted to data input/output terminal T through selector 13 and output buffer 11. When address signal a0 to an and address signal b0 to bn coincide with each other, nodes N24 and N25 stay at H level as are without change in level, signal CT assumes H level and output data signal Din of register 5 is outputted to data input/output terminal T through selector 13 and output buffer 11.

In this embodiment, since whether or not two address signals a0 to an and b0 to bn inputted consecutively coincide with each other is detected by n+1 EX-OR gates 26.0 to 26.n and a wired OR gate, whether or not two address signals a0 to an and b0 to bn can be detected more quickly as compared with a prior art practice in which a multi-stage gate circuit was adopted, thereby enabling a high speed operation in SRAM.

(Second Embodiment)

Figure 6:
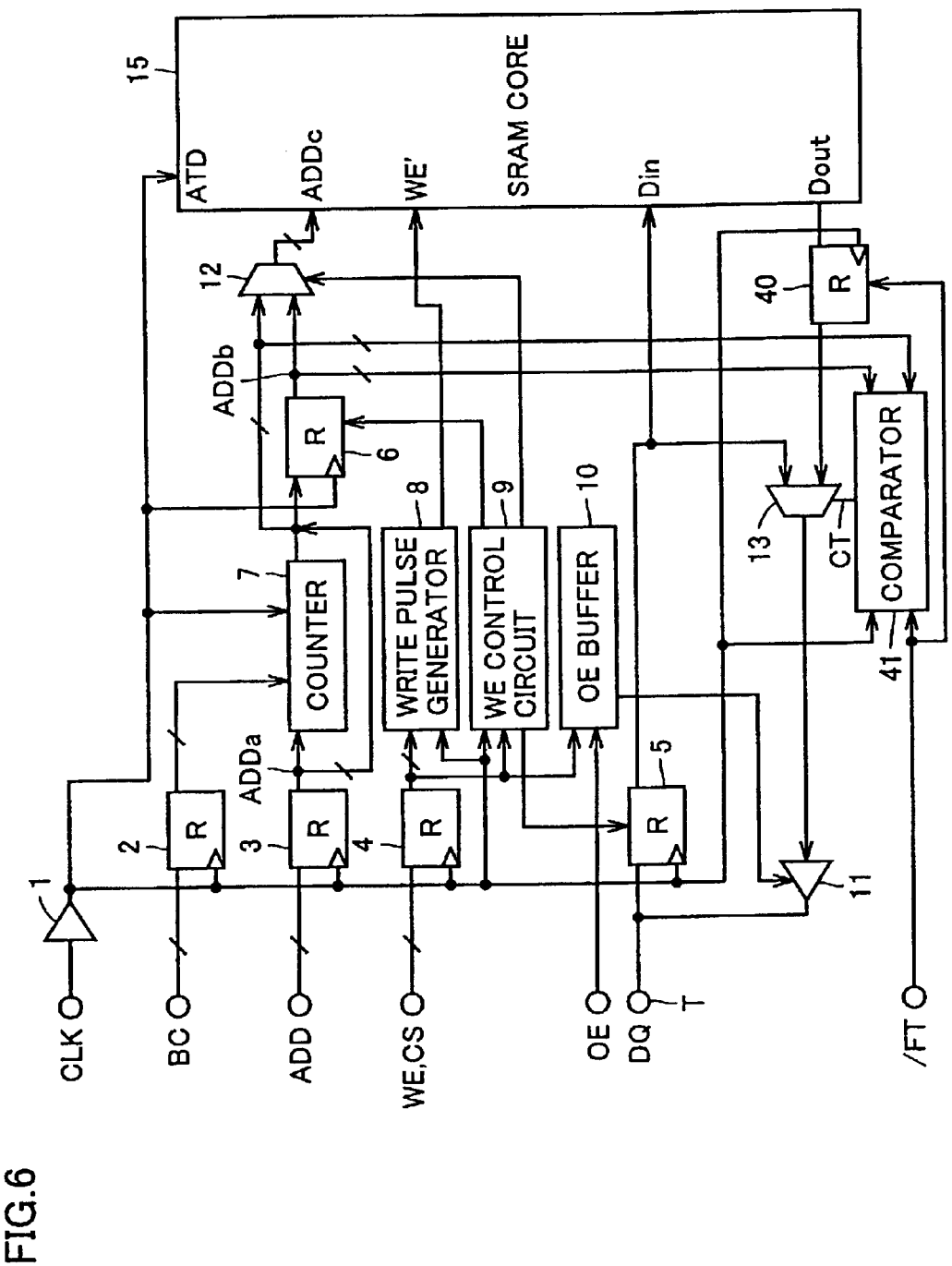
FIG. 6 is a circuit block diagram showing an overall configuration of synchronous SRAM according to a second embodiment of the present invention.

FIG. 6 is a block diagram showing an overall configuration of late-write, flow-through/pipe-line switch synchronous SRAM according to a second embodiment of the present invention, which are to be compared with that of FIG. 1.

Referring to FIG. 6, SRAM in the second embodiment is different from SRAM of FIG. 1 in that in SRAM of FIG. 1, a register 40 is added and comparator 14 is replaced with a comparator 41 and a switch signal /FT is newly introduced. Signal /FT is set to L level when SRAM is used as the flow-through type and to H level when SRAM is used as the pipe-line type.

Figure 15:
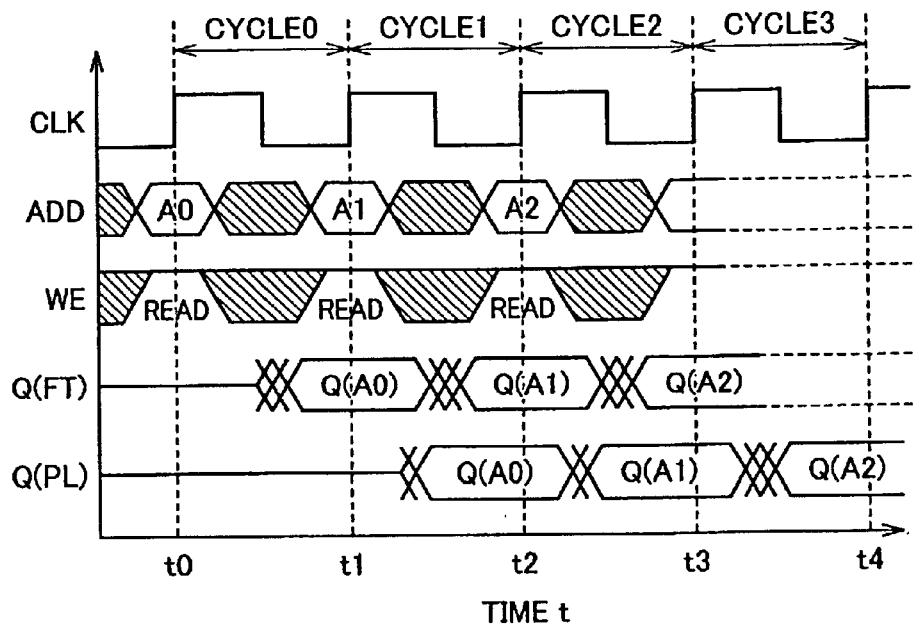
FIG. 15 is a time chart showing a read operation in a prior art synchronous SRAM.
Figure 16:
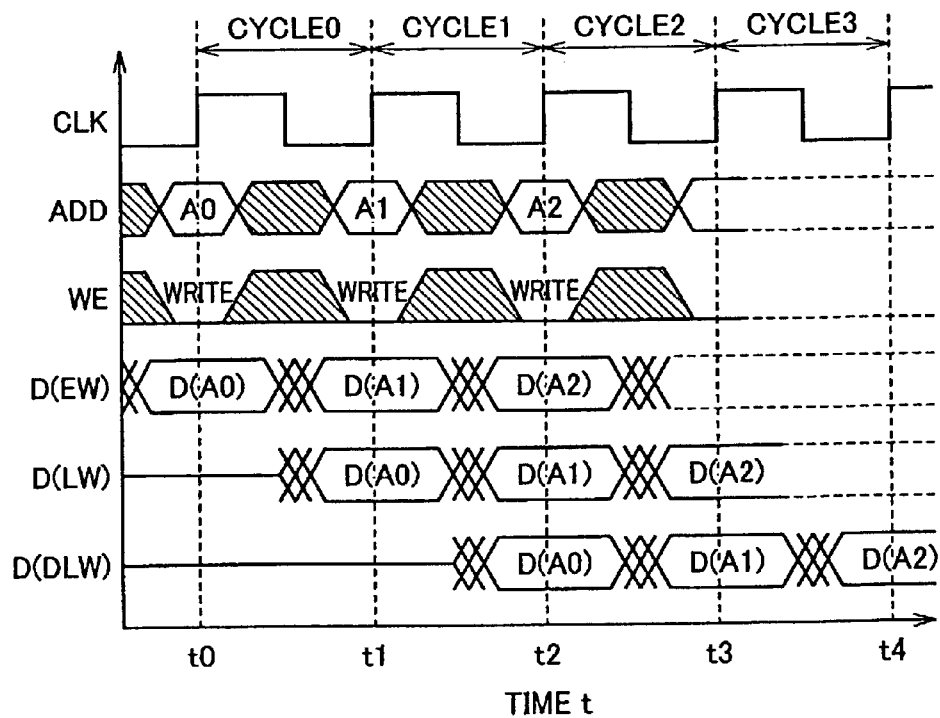
FIG. 16 is a time chart showing a write operation in a prior art synchronous SRAM.
Figure 17:
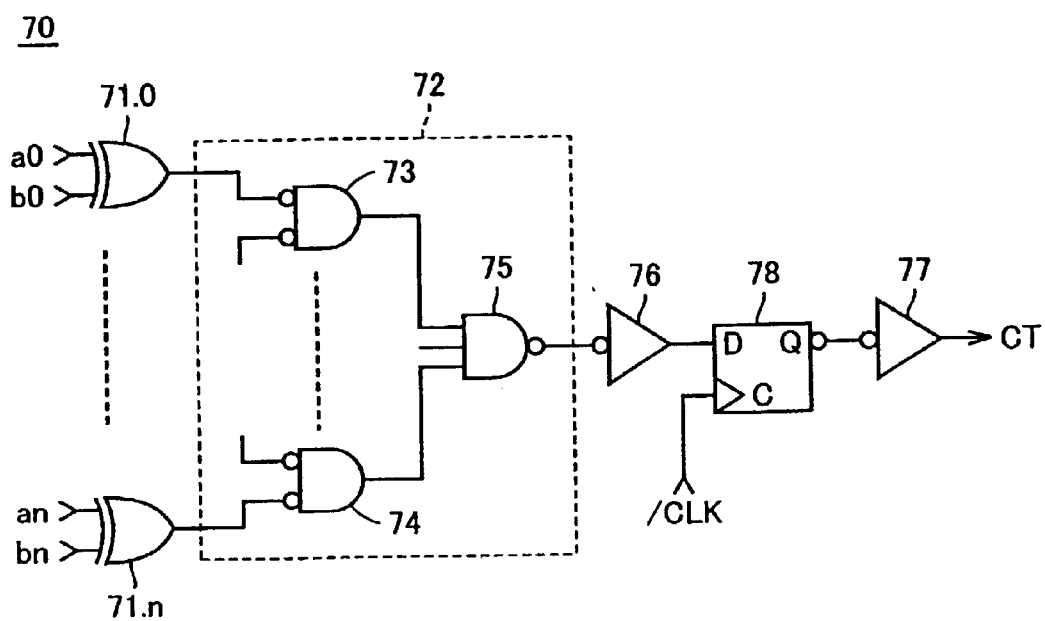
FIG. 17 is a circuit diagram showing a configuration of a comparator of a prior art synchronous SRAM.

Register 40 is inserted between the data output node of SRAM core 15 and selector 13 and when signal /FT is at L, enters a through state and transmits output data signal Dout of SRAM core 15 to selector 13 independently of clock signal CLK. On the other hand, when signal /FT is at H level, register 40 operates as an ordinary register; and during a period when clock signal CLK is at L level, captures output data signal Dout of SRAM core 15, and holds and outputs a level of captured data signal Dout that the register 40 has captured in response to a rising edge of clock signal CLK. Accordingly, when SRAM is used as the pipe-line type, read data signal Q is outputted in a cycle subsequent to a cycle in which a read command is inputted (see FIG. 15).

Figure 7:
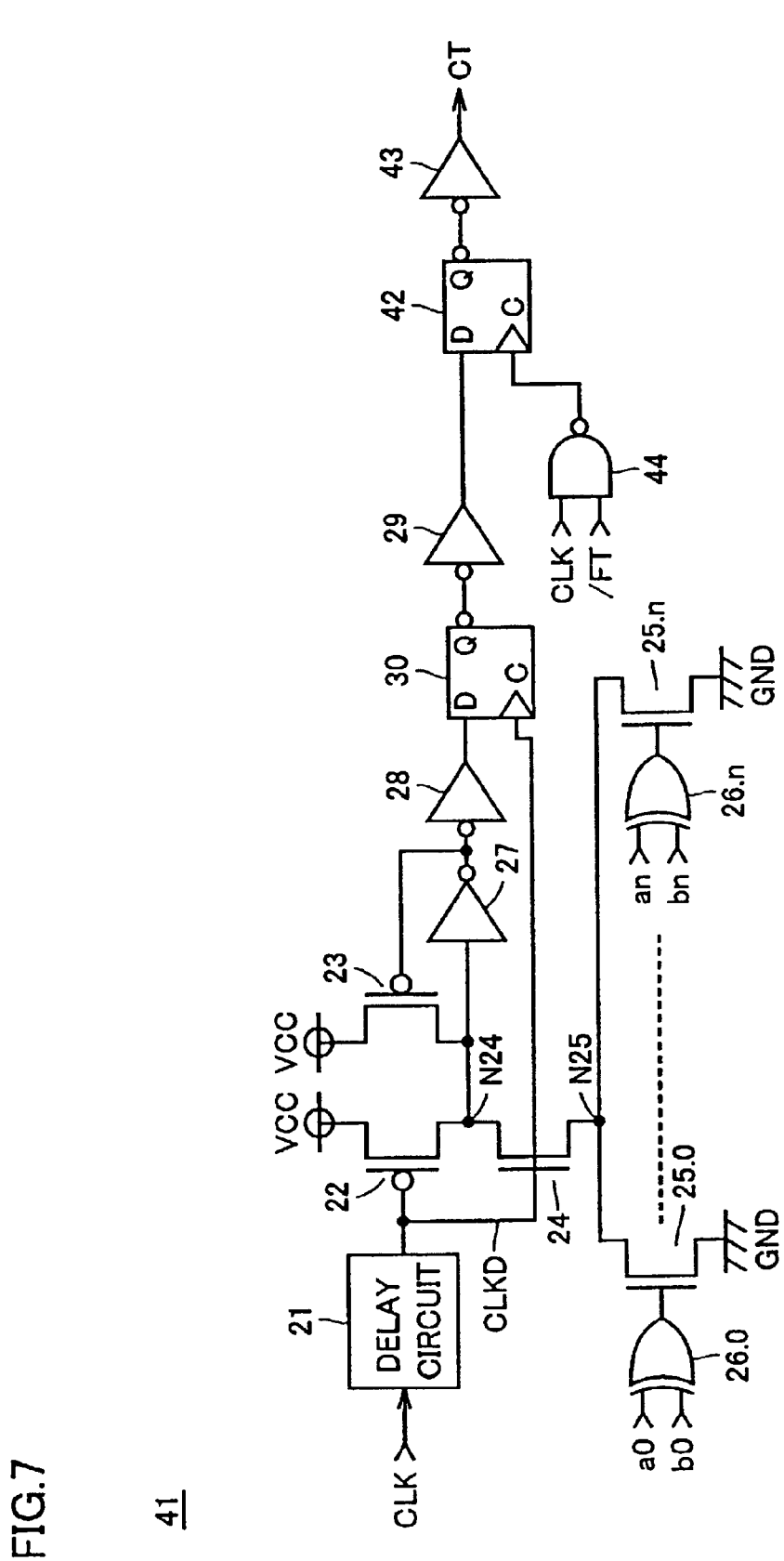
FIG. 7 is a circuit block diagram showing a configuration of a comparator shown in FIG. 6.

Comparator 41, as shown in FIG. 7, has a configuration obtained by adding a latch circuit 42, an inverter 43 and a NAND gate 44 to comparator 14 of FIG. 4. Latch circuit 42 is of the same configuration as that of latch circuit 30. An output signal of inverter 29 is inputted to the data input terminal D of latch circuit 42. An output signal of latch circuit 42 is inverted by inverter 43 into signal CT. NAND gate 44 receives clock signal CLK and signal /FT and an output signal thereof is inputted to the clock terminal C of latch circuit 42.

When signal /FT is at L level, an output signal of NAND gate 44 is fixed at H level independently of clock signal CLK to causes latch circuit 42 to be in a through state. Therefore, comparator 41 is of the same configuration as that of comparator 14 of FIG. 4.

When signal /FT is at H level, NAND gate 40 operates as an inverter for clock signal CLK and the inverted signal /CLK of clock signal CLK is inputted to the clock terminal C of latch circuit 42. Therefore, signal CT is delayed by latch circuit 42 by a half cycle, thereby enabling an output timing of resister 40 and output timing signal CT to coincide with each other.

In this second embodiment, the same effect as that of the first embodiment is attained and in addition to this, selection can be made in respect to whether SRAM is used as the flow-through type or the pipe-line type by setting signal /FT to L level or H level.

Note that while in this second embodiment, signal /FT is inputted externally, limitation is imposed to this, but signal /FT may be generated internally with a so-called address key with which a prescribed address signal ADD is inputted at a prescribed timing. In this case, no necessity arises for specially providing an input terminal for signal /FT.

(Third Embodiment)

In comparators 14 and 41 of the respective first and second embodiments, with increase in number n+1 of data signals included in address signal ADD, a problem arises that a normal operation is not secured. For example, in comparator 41 of FIG. 7, if a number n+1 of data signals included in address signal ADD becomes larger to thereby increase the number of N-channel MOS transistors 25.0 to 25.n, not only does parasitic capacitance of node N25 build up, but leakage currents of N-channel MOS transistors 25.0 to 25.n grows. Accordingly, even when address signal a0 to an and address signal b0 to bn coincide with each other and all of N-channel MOS transistors 25.0 to 25.n become nonconductive, node N24 assumes L level if not only P-channel MOS transistor 22 becomes conductive, but N-channel MOS transistor 24 also becomes conductive. In order to prevent this from occurring, P-channel MOS transistor 23 is provided, but a size of P-channel MOS transistor 23 is set to a small value, so if the number of N-channel MOS transistors 25.0 to 25.n is in excess, node N25 cannot be held at H level.

FIGS. 8A to 8C are time charts showing a state of such a malfunction. In FIGS. 8A to 8C, it is set that address signal a0 to an and address signal b0 to bn coincide with each other during a period when data signal an included in address signal ADD is at H level, while address signal a0 to an and address signal b0 to bn do not coincide with each other during a period when data signal an is at L level. When data signal an and clock signal CLKD are both at H level, it is required that nodes N24 and N25, and signal CT are at H level, but nodes N24 and N25 cannot be at H level, resulting in a malfunction, since the number of N-channel MOS transistors 25.0 to 25.n is in excess.

If in order to such a malfunction, a size of P-channel MOS transistor 23 is set to a large value, to the contrary, nodes N24 and N25 cannot be lowered to L level even when address signal a0 to an and address signal b0 to bn do not coincide with each other.

FIGS. 9A to 9C are time charts showing a state of such a malfunction. In FIGS. 9A to 9C, it is also set that address signal a0 to an and address signal b0 to bn coincide with each other during a period when data signal an is at H level, while address signal a0 to an and address signal b0 to bn do not coincide with each other during a period when data signal an is at L level. When not only is data signal an at L level, but clock signal CLKD is also at H level, it is required that nodes N24 and N25, and signal CE are at L level, but nodes N24 and N25 cannot be at L level, resulting in a malfunction, since a size of P-channel MOS transistor 23 is excessively large. In this third embodiment, this problem is solved.

Figure 10:
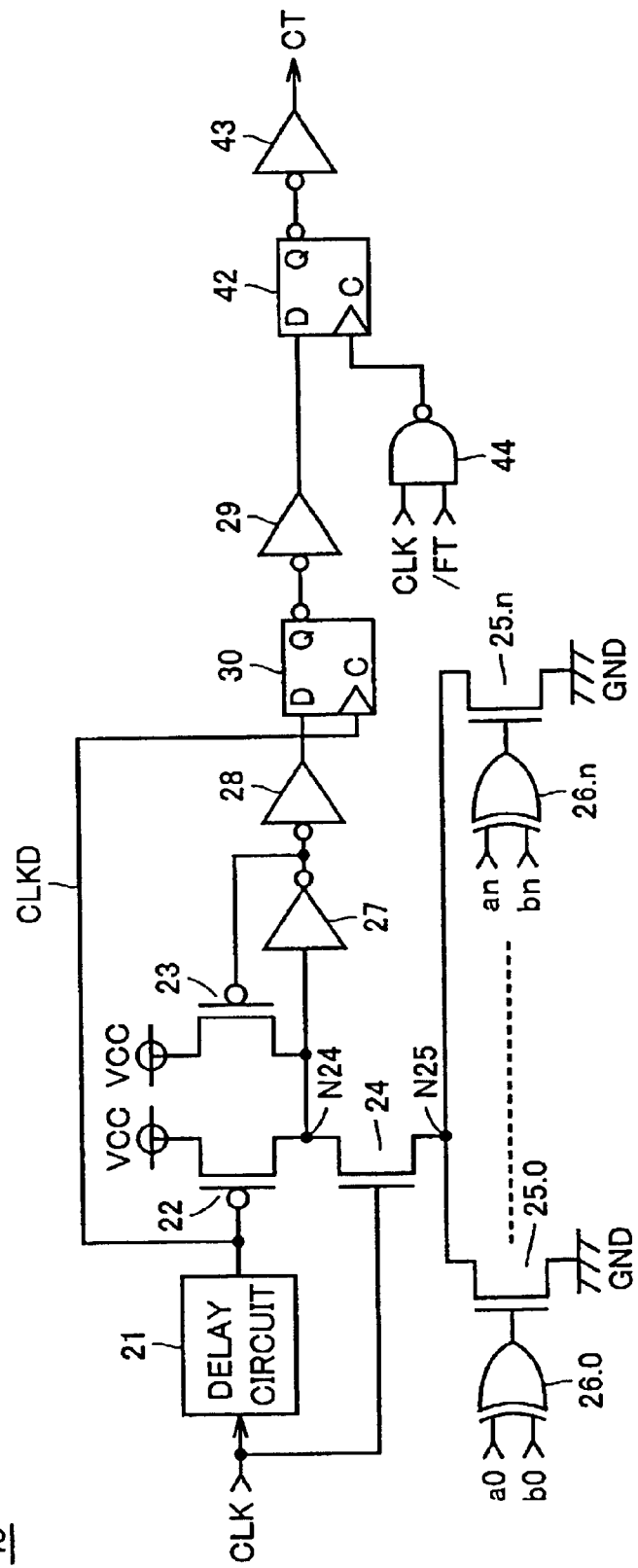
FIG. 10 is a circuit block diagram showing a configuration of a comparator of synchronous SRAM according to a third embodiment of the present invention.

FIG. 10 is a circuit block diagram showing a configuration of comparator 45 of SRAM according to a third embodiment of the present invention, which is to be compared with FIG. 7. Referring to FIG. 10, comparator 45 is different from comparator 41 of FIG. 7 is that clock signal CLK is given to the gate of N-channel MOS transistor 24 instead of output clock signal CLKD of delay circuit 21.

Figure 11A:
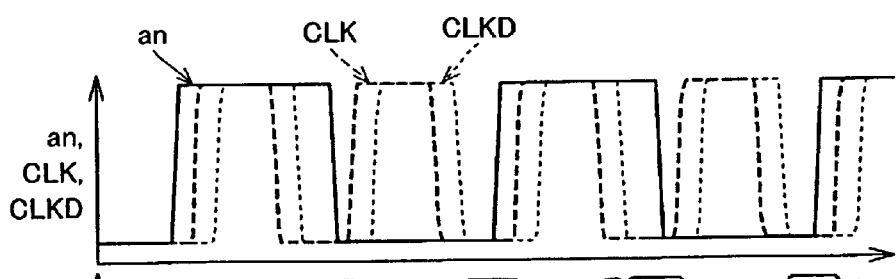
FIGS. 11A to 11C are time charts showing an operation in the comparator shown in FIG. 10.
Figure 11B:
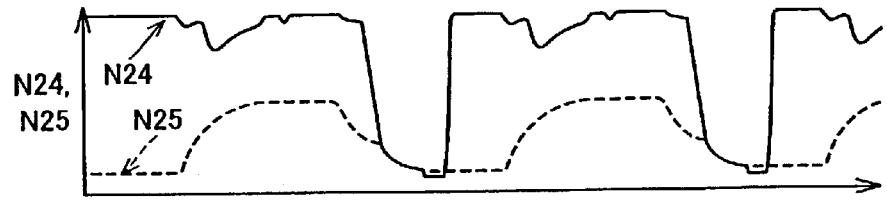
Figure 11C:
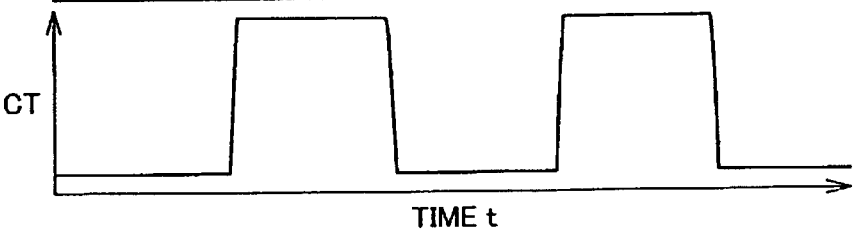

FIGS. 11A to 11C are time charts for showing an operation in comparator 45. It is set that signal /FT is at L level. In FIGS. 11A to 11C, since address signal a0 to an and address signal b0 to bn do not coincide with each other during a period when data signal an is at L level, at least one N-channel MOS transistor of N-channel MOS transistors 25.0 to 25.n becomes conductive to cause node N25 to be at L level.

When data signal an is raised from L level to H level, address signal a0 to an and address signal b0 to bn coincide with each other and therefore, all of N-channel MOS transistors 25.0 25.n become conductive. Next, when clock signal CLK is raised from L level to H level, N-channel MOS transistor 24 becomes conductive to charge node N25. At this time, since a current is supplied to node N24 through P-channel MOS transistors 22 and 23, there is no chance that node N24 is pulled down to L level even if a size of P-channel MOS transistor 23 is small.

Next, when clock signal CLKD is raised from L level to H level, P-channel MOS transistor 22 becomes non-conductive, but since nodes N24 and N25 have been sufficiently charged, levels of nodes N24 and N25 are held by P-channel MOS transistor 23. Moreover, when clock signal CLKD is raised to H level, latch circuit 30 enters a through state to raise signal CT to H level. Note that since signal /FT is at L level, latch circuit 42 fixedly stays in a through state.

Subsequently, when clock signals CLK and CLKD are sequentially lowered to L level, not only does P-channel MOS transistor 22 become conductive, but N-channel MOS transistor 24 also becomes non-conductive to charge node 24 to H level. Then, when data signal an is lowered from H level to L level, address signal a0 to an and address signal b0 to bn do not coincide with each other and at least one N-channel MOS transistor of N-channel MOS transistors 25.0 to 25.n becomes conductive to reduce a potential of node N25 gradually.

Subsequently, clock signals CLK and CLKD are raised to H level, not only does N-channel MOS transistor 24 become conductive, but P-channel MOS transistor 22 also becomes non-conductive. Thereby, potentials of nodes N24 and N25 cannot be held by P-channel MOS transistor 23 and the potentials of nodes N24 and N25 fall down rapidly and signal CT is also lowered from H level to L level.

In this third embodiment, since P-channel MOS transistor 22 becomes non-conductive after N-channel MOS transistor 24 becomes conductive, comparator 45 stably operates even if the number of N-channel MOS transistors 25.0 to 25.n increases.

(Fourth Embodiment)

Comparators 14, 41 and 45 in the first to third embodiments each use n+1 EX-OR gates 26.0 to 26.n. Since one EX-OR gate includes 10 MOS transistors, if the number of data signals a0 to an included in address signal ADD increases, the number of MOS transistors constituting of a comparator increases, so a problem arises that a circuit area of the comparator increases.

Figure 12:
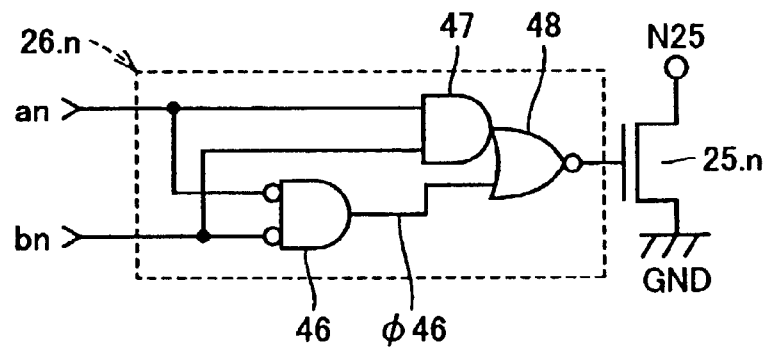
FIG. 12 is a circuit diagram for describing a problematic point of the first to third embodiments.

That is, EX-OR 26, as shown in FIG. 12, includes: a NOR gates 46 and 48; and NAND gate 47. NOR gate 46 receives data signals an and bn. AND gate 47 receives data signals an and bn. NOR gate 48 receives output signals of NOR gate 46 and AND gate 47 and an output thereof is inputted to the gate of N-channel MOS transistor 25.n.

When data signals an and bn are both at L level, an output signal φ46 of NOR gate 46 is at H level and an output signal of NOR gate 48 is at L level. When data signals an and bn are both at H level, an output signal of AND gate 47 is at H level and an output signal of NOR gate 48 is at L level. When data signals an and bn are different in level from each other, output signals of NOR gate 46 and AND gate 47 are both at L level and an output signal of NOR gate 48 is at H level.

Figure 13:
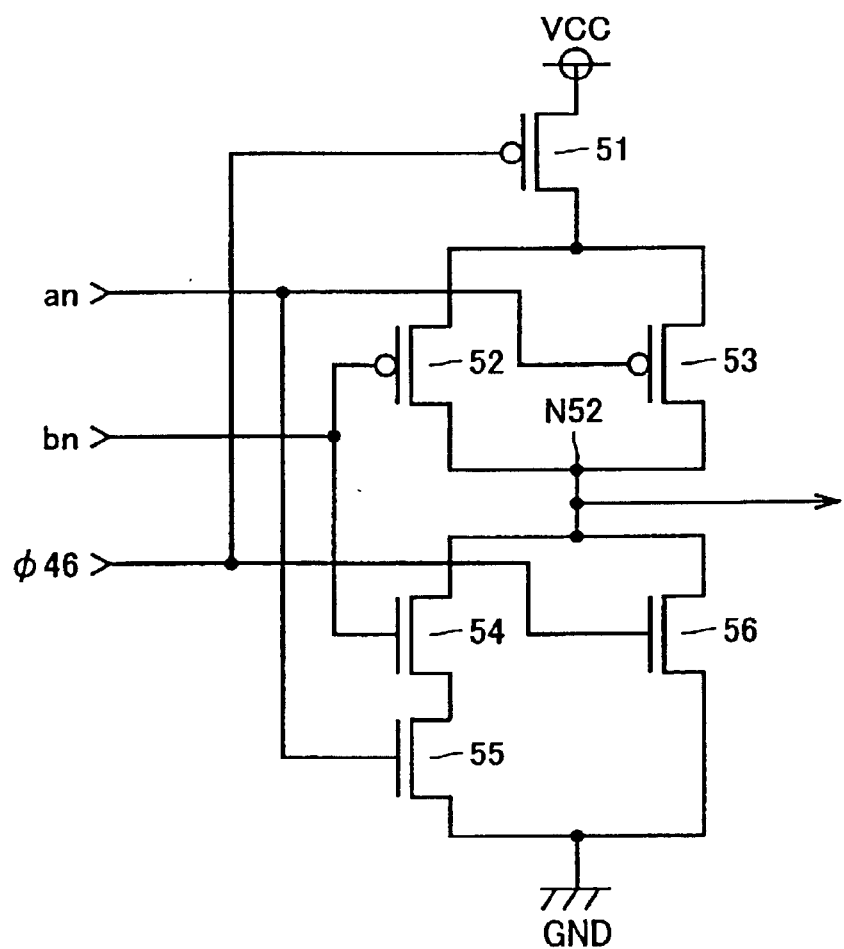
FIG. 13 is a circuit diagram showing a configuration of a gate circuit including an AND gate 47 and a NOR gate 48 shown in FIG. 12.

FIG. 13 is a circuit diagram showing a configuration of a gate circuit including AND gate 47 and NOR gate 48 shown of FIG. 12. In FIG. 13, the gate circuit includes: three P-channel MOS transistors 51 to 53 and three N-channel MOS transistors 54 to 56. P-channel MOS transistor 51 receives power supply potential VCC at the source thereof and receives output signal φ46 of NOR gate 46 at the gate thereof. P-channel MOS transistors 52 and 53 are connected in parallel between the drain of P-channel MOS transistor 51 and output node N52, and receive data bn and an at the respective gates thereof. N-channel MOS transistors 54 and 55 are connected in series between output node N52 and a line of ground potential GND, and receive data signals bn and an at the respective gates thereof. N-channel MOS transistor 56 is connected between output node N52 and a line of ground potential GND and receives signal φ46 at the gate thereof.

When signal φ46 is at H level, not only does P-channel MOS transistor 51 become non-conductive, but N-channel MOS transistor 56 also becomes conductive and output node N52 assumes L level independently of data signals an and bn. When signal φ46 is at L level, not only does P-channel MOS transistor 51 become conductive, but N-channel MOS transistor 56 also becomes non-conductive and the gate circuit operates as a NAND gate for data signals an and bn.

That is, when data signals an and bn are both at H level, not only do P-channel MSO transistors 52 and 53 become non-conductive, but N-channel MOS transistors 54 and 55 also become conductive to cause output node N52 to be at L level. When at least one data signal of data signals an and bn is at L level, not only does at least one P-channel MOS transistor of P-channel MOS transistors 52 and 53 become conductive, but at least one N-channel MOS transistor of N-channel MOS transistors 54 and 55 also becomes non-conductive to cause output node N52 to be at H level.

In such a way, the gate circuit including AND gate 47 and NOR gate of FIG. 12 is constituted of six MOS transistors, and NOR gate 46, as is well known, is constituted of four MOS transistors. Therefore, in order to compare data signals an and bn with each other, eleven MOS transistors are required if including N-channel MOS transistor 25.n. Accordingly, with increase in the number n+1 of data signals included in address ADD, the number of MOS transistors increases together with an increased area of the comparator. In this fourth embodiment, this problem is solved.

FIG. 14 is a circuit diagram showing a configuration of a comparison unit circuit 60.n included in a comparator of SRAM according to the fourth embodiment of the present invention. Comparison unit circuit 60.n is a circuit corresponding to EX-OR gate 26.n and N-channel MOS transistors 25.n of FIG. 12 and includes: four N-channel MOS transistors 61 to 64 and two inverters 60 and 66. N-channel MOS transistors 61 and 63 are connected in series between node N25 and a line of ground potential GND and N-channel MOS transistors 62 and 64 are connected in series between node N25 and a line of ground potential GND. Data signal an is inputted not only directly to the gate of N-channel MOS transistor 62, but also to the gate of N-channel MOS transistor 63 through inverter 65. Data signal bn is inputted not only directly to the gate of N-channel MOS transistor 61, but also to the gate of N-channel MOS transistor 64 through inverter 66.

When data signals an and bn are both at H level, not only do N-channel MOS transistors 61 and 62 become conductive, but N-channel MOS transistors 63 and 64 also become non-conductive to establish a non-conductive state between node N25 and a line of ground potential GND. When data signals an and bn are both at L level, not only do N-channel MOS transistors 61 and 62 become non-conductive, but N-channel MOS transistors 63 and 64 also become conductive to establish a non-conductive state between node N25 and a line of ground potential GND.

When data signals an and bn are at H level and L level, respectively, not only do N-channel MOS transistors 62 and 64 become conductive, but N-channel MOS transistors 61 and 63 also become non-conductive to cause node N25 to be grounded through N-channel MOS transistors 62 and 64. When data signals an and bn are at L level and H level, respectively, not only do N-channel MOS transistors 61 and 63 become conductive, but N-channel MOS transistors 62 and 64 also become non-conductive to cause node N25 to be grounded through N-channel MOS transistors 61 and 63.

Accordingly, when data signals an and bn coincide with each other, node N25 is caused to be in a floating state, while when data signals an and bn do not coincide with each other, node N25 is grounded. Therefore, comparison unit circuit 60.n has the same function as EX-OR gate 26.n and N-channel MOS transistor 25.n of FIG. 12.

Since each of inverters 60 and 66, as is well known, are constituted of two MOS transistors, comparison unit circuit 60.n is constructed of eight MOS transistors. Accordingly, with adoption of comparison unit circuit 60.n, the number of MOS transistors in need is reduced by three as compared with a case where EX-OR gate 26.n and N-channel MOS transistor 25.n of FIG. 12 are used, thereby resulting in a smaller circuit area of the comparator.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capturing an address signal in response to a leading edge of a clock signal comprising:

plural memory cells;

a select circuit selecting a memory cell of said plural memory cells according to an address signal;

a write/read circuit performing writing/reading of a data signal to/from the memory cell selected by said select circuit; and a coincidence/non-coincidence detecting circuit detecting whether or not inputted two address signals coincide with each other to output a control signal controlling said write/read circuit on the basis of a result of the detection, wherein said coincidence/non-coincidence detecting circuit includes:

a charge circuit for charging a prescribed node to a first potential;

plural discharge circuits provided correspondingly to respective plural signals included in an address signal, and each receiving respective corresponding two signals included in inputted two address signals to discharge said prescribed node to a second potential in response to a situation where two signals that each discharge circuit has received are different from each other in logical level; and a signal generating circuit generating said control signal on the basis of a potential of said prescribed node.

2. The semiconductor memory device according to claim 1, wherein said charge circuit includes:

a first switching element connected between a line of said first potential and said prescribed node, and becoming conductive in response to a tailing edge of said clock signal, while becoming non-conductive in response to a leading edge of said clock signal; and a second switching element, one electrode of which is connected to said prescribed node, the other electrode of which is connected to said plural discharge circuits, and becoming conductive in response to a leading edge of said clock signal, while becoming non-conductive in response to a tailing edge of said clock signal.

3. The semiconductor memory device according to claim 2, wherein said charge circuit further includes a delay circuit delaying said clock signal by a prescribed time, and said first switching element becomes conductive in response to a tailing edge of an output clock signal of said delay circuit, while becoming non-conductive in response to a leading edge of an output clock signal of said delay circuit.

4. The semiconductor memory device according to claim 3, wherein said second switching element becomes conductive in response to a leading edge of an output clock signal of said delay circuit, while becoming non-conductive in response to a tailing edge of an output clock signal of said delay circuit.

5. The semiconductor memory device according-to claim 2, wherein said charge circuit further includes a half latch circuit having a predetermined current drivability and holding said prescribed node at said first potential.

6. The semiconductor memory device according to claim 2, wherein said discharge circuit includes:
 a third switching element connected between the other electrode of said second switching element and a line of said second potential; and
 an exclusive OR circuit causing said third switching element to be conductive in response to a situation where corresponding two signals are different from each other in logical level.

7. The semiconductor memory device according to claim 2, wherein said discharge circuit includes:
 a fourth switching element, one electrode of which is connected to the other electrode of said second switching element, and being conductive when one signal of corresponding two signals is at a first logical level;
 a fifth switching element connected between the other electrode of said fourth switching element and a line of said second potential, and becoming conductive when the other signal of said two signals is at a second logical level;
 a sixth switching element, one electrode of which is connected to the other electrode of said second switching element, and becoming conductive when the other signal of said two signals is at a first logical level; and
 a seventh switching element connected between the other electrode of said sixth switching element and the line of said second potential, and becoming conductive when one signal of said two signals is at a second logical level.

8. The semiconductor memory device according to claim 1, wherein said signal generating circuit includes a potential detecting circuit having a predetermined threshold potential between said first and second potentials, outputting a signal at a first level when a potential of said prescribed node exceeds said threshold potential, and outputting a signal at a second level when a potential of said prescribed node does not exceed said threshold potential.

9. The semiconductor memory device according to claim 8, wherein said signal generating circuit further includes a first latch circuit receiving an output signal of said potential detecting circuit, causing an output signal of said potential detecting circuit to pass through itself in response to a leading edge of said clock signal, and holding and outputting a level of an output signal of said potential detecting circuit in response to a tailing edge of said clock signal.

10. The semiconductor memory device according to claim 9, wherein said signal generating circuit further includes a second latch circuit receiving an output signal of said first latch circuit, causing an output signal of said first latch circuit to pass through itself independently of said clock signal when said semiconductor memory device is used as a flow-through type, and causing an output signal of said first latch circuit to pass through itself in response to a tailing edge of said clock signal and holding and outputting an output signal of said first latch circuit in response to a leading edge of said clock signal when said semiconductor memory device is used as a pipe-line type.

11. The semiconductor memory device according to claim 1, further comprising:

a first register holding and outputting an address signal in response to a leading edge of said clock signal; and a second register holding and outputting an output address signal of said first register in response to a leading edge of said clock signal, wherein said select circuit, in read and write operations, selects a memory cell of said plural memory cells according to output addresses of said first and second registers, respectively and said coincidence/non-coincidence detecting circuit detects whether or not output addresses of said first and second registers coincide with each other.

* * * * *